(12) United States Patent
Kimura et al.

(10) Patent No.: US 6,189,213 B1
(45) Date of Patent: Feb. 20, 2001

(54) METHOD FOR MANUFACTURING COOLING UNIT COMPRISING HEAT PIPES AND COOLING UNIT

(75) Inventors: Yuichi Kimura; Masaaki Yamamoto; Suemi Tanaka, all of Tokyo (JP)

(73) Assignee: Furukawa Electric Co., Ltd., Tokyo (JP)

( * ) Notice: Under 35 U.S.C. 154(b), the term of this patent shall be extended for 0 days.

(21) Appl. No.: 09/356,180

(22) Filed: Jul. 16, 1999

Related U.S. Application Data

(62) Division of application No. 08/970,739, filed on Nov. 4, 1997, now Pat. No. 6,122,138.

(30) Foreign Application Priority Data

Nov. 15, 1996 (JP) ..................................................... 8-304697

(51) Int. Cl.$^7$ ................................................... B23P 15/00
(52) U.S. Cl. ................................ 29/890.035; 29/890.03; 165/80.3
(58) Field of Search ........................... 29/80.03, 890.038, 29/890.035; 165/80.3

(56) References Cited

U.S. PATENT DOCUMENTS

| | | | |
|---|---|---|---|
| 2,732,615 | * | 1/1956 | Sandberg . |
| 2,867,417 | | 1/1959 | Axlander . |
| 3,387,653 | | 6/1968 | Coe . |
| 3,630,799 | | 12/1971 | Crimmins . |
| 3,686,081 | | 8/1972 | Butter et al. . |
| 3,698,475 | * | 10/1972 | Beck, Jr. . |
| 3,767,759 | | 10/1973 | Wichterle et al. . |
| 3,813,767 | | 6/1974 | Sasaki et al. . |
| 4,026,006 | | 5/1977 | Moebius . |
| 4,078,604 | | 3/1978 | Christl et al. . |
| 4,160,476 | | 7/1979 | Ashton et al. . |
| 4,492,851 | * | 1/1985 | Carr . |
| 5,025,546 | | 6/1991 | Gotoh et al. . |
| 5,070,606 | | 12/1991 | Hoopman et al. . |
| 5,253,702 | * | 10/1993 | Davidson et al. .............. 29/890.032 |
| 5,339,214 | | 8/1994 | Nelson . |
| 5,549,155 | | 8/1996 | Meyer, IV et al. . |
| 5,725,050 | | 3/1998 | Meyer, IV et al. . |
| 5,826,645 | | 10/1998 | Meyer, IV et al. . |
| 5,957,737 | * | 9/1999 | Ozai . |
| 5,983,995 | * | 11/1999 | Shutou et al. . |

FOREIGN PATENT DOCUMENTS

| | | | |
|---|---|---|---|
| 401044071A | * | 2/1989 | (JP) . |
| 409229517A | * | 9/1997 | (JP) . |
| 11307670A | * | 4/1998 | (JP) . |

\* cited by examiner

*Primary Examiner*—I. Cuda-Rosenberg
(74) *Attorney, Agent, or Firm*—Thorp Reed & Armstrong

(57) ABSTRACT

The present invention relates to a cooling unit for electronic devices wherein the manufacturing method comprises the steps of: (a) preparing a plate-type metal block for removing heat generated from an electronic component, the metal block having holes in the thickness part of the metal block and having convex portions formed on one main surface or both main surfaces of the metal block; (b) inserting heat pipes into the holes; and (c) applying a local and two-dimensional force from the surface of the metal block to the convex portions to make the surface flat bringing the outer surface of each heat pipe into close contact with the inner wall of each hole in the metal block.

6 Claims, 8 Drawing Sheets

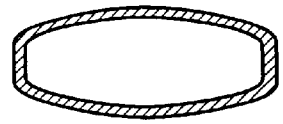
Fig. 2A  Fig. 2B  Fig. 2C
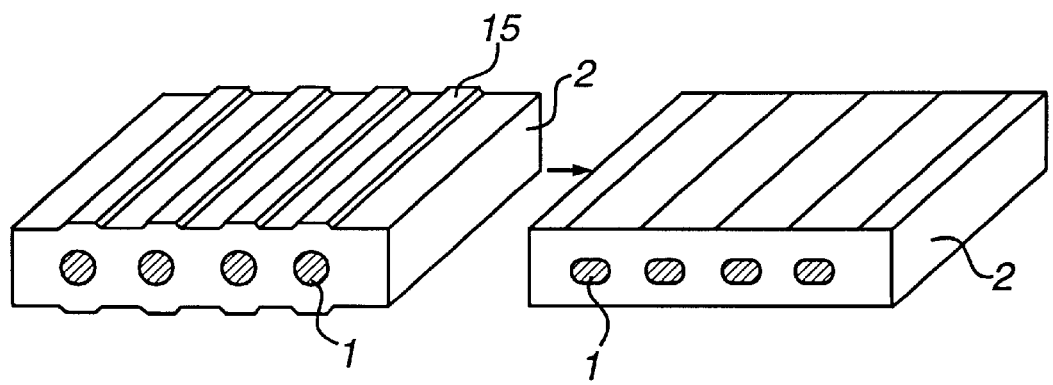
Fig. 3A  Fig. 3B
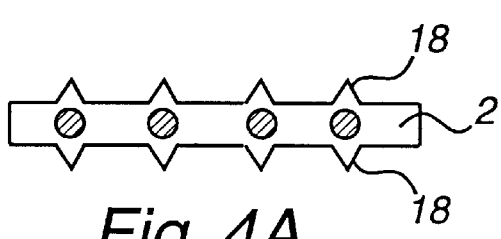
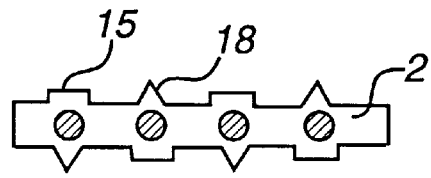
Fig. 4A  Fig. 4B
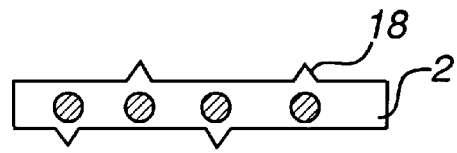
Fig. 4C

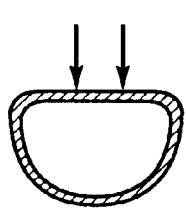
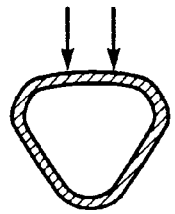
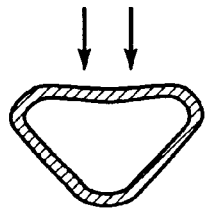
Fig. 8A     Fig. 8B     Fig. 8C
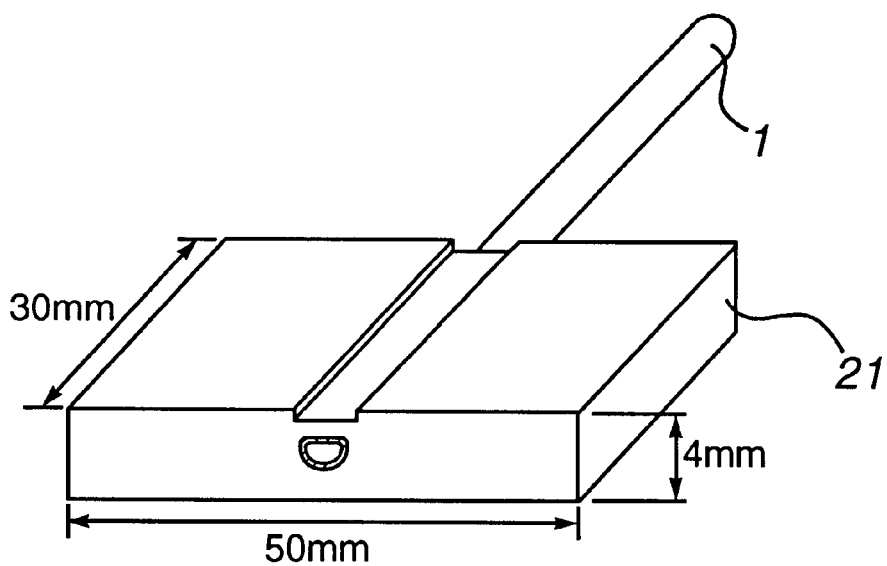
Fig. 9

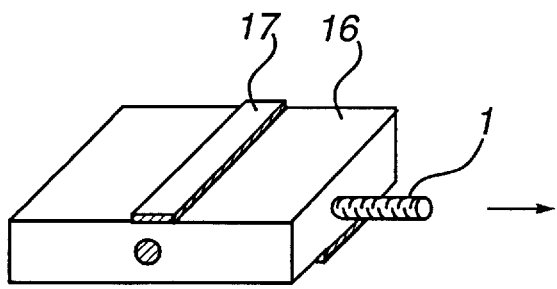 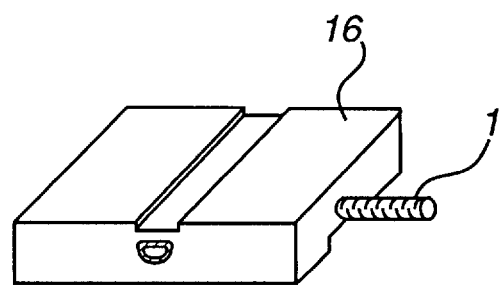
Fig. 10A              Fig. 10B
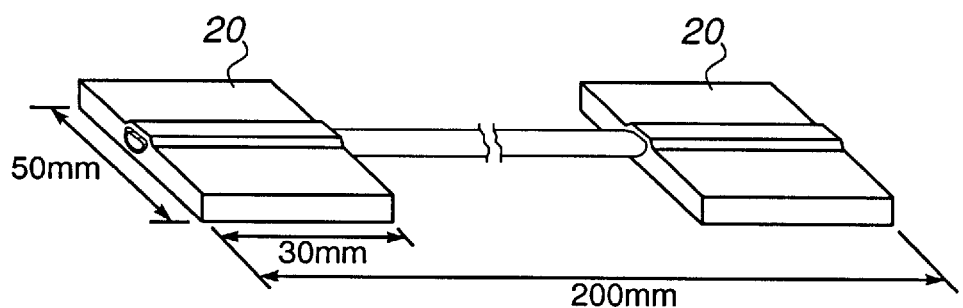
Fig. 11

METHOD FOR MANUFACTURING COOLING UNIT COMPRISING HEAT PIPES AND COOLING UNIT

This is a division of application Ser. No. 08/970,739 which was filed on Nov. 14, 1997, now U.S. Pat. No. 6,122,138.

BACKGROUND OF THE INVENTION

1. Field of the Invention

The present invention relates to a method for manufacturing a cooling unit and the cooling unit comprising heat pipes for diffusing heat generated from electronic components or the like which has a semiconductor device and others mounted thereon and generates heat.

2. Description of the Related Art

As a means for preventing electronic equipment from overheating, a forced-air cooling system employing an air-cooled fan has been adopted. However, in high-density packaging electronic equipment typified by recent computers, heat generated by the equipment tends to prominently increase because of the high density of heat generating components such as integrated circuits (IC) or large scale integration (LSI) mounted in the equipment, and the cooling system using the air-cooled fan has a limited cooling capability.

Further, with the rapid advance of reducing the size of electronic equipment, a space for mounting the cooling unit becomes smaller within the equipment, which makes heat diffusion in the electronic equipment difficult.

As a countermeasure for solving such problems, there has been proposed a mechanism by which heat generated by electronic components or electronic devices (referred to as electronic components hereinafter) is received by a heat conductor and that heat is then removed from the electronic components. Such a mechanism is partially put into practical use. According to this method, a heat conductive plate or the like is brought into contact with the electronic components which must be cooled down and heat of the electronic components is diffused to the plate or the like to suppress excessive increase in temperature of the electronic components. Moreover, the heat diffused to the plate or the like is further diffused in the electronic equipment or discharged outside the electronic equipment if necessary.

When bringing the heat conductor into contact with a specific electronic component for the purpose of cooling, it is desired to increase the volume of the heat conductor to enlarge the heat capacity thereof and to increase the area of the heat conductor which is brought into contact with the electronic component to increase the speed of transferring heat from the electronic component. However, because minimization of electronic components have been advanced in recent days, the contact area of such components relative to the heat conductor is limited, and use of the cooling unit having a large volume is impossible.

A method for enhancing heat diffusion by attaching heat pipes to the heat conductor has been, therefore, proposed. Working liquid that repeatedly evaporates and condenses is sealed inside the heat pipe, and heat generated from the electronic component is transferred to an evaporation part of the heat pipe. The evaporated working liquid is then moved to a condensation part to condense in order to discharge heat. Excellent heat dissipation can be realized because the speed of the working liquid is extremely high.

FIGS. 14 through 16 show an example of a conventional cooling unit utilizing such heat pipes. FIG. 14 is a plan view showing a conventional cooling unit; FIG. 15 is a partially enlarged cross-sectional view taken along line A—A of FIG. 16; and FIG. 16 is a front view of the cooling unit. This cooling unit constitutes heat pipes 1 each of which has a flat cross section and has an outer diameter of approximately 2 mm in the vertical direction that transverses the length of the pipe and an outer diameter of approximately 4 mm in the horizontal direction that transverses the length of the pipe, a metal block 2 attached to an evaporation part 10 of each heat pipe 1, and radiation fins 3 disposed to a condensation part 11 of each heat pipe 1. As for the metal block 2, aluminum or aluminum alloy is generally used for reducing the weight and size of the cooling unit. Attachment of the heat pipe 1 to the metal block 2 in the evaporation part 10 is achieved by forming a pipe insertion hole 21 slightly larger than the flat heat pipe 1 in the metal block 2 in the direction of the thickness and inserting the flat heat pipe 1 into the pipe insertion hole 21 as shown in FIG. 15. Soldering metal 20 is subsequently poured into a gap between the surface of the heat pipe and an inner wall of the insertion hole 21 for integration.

In this-configured cooling unit comprising heat pipes, the main back surface of the metal block 2 is brought into contact with each heat generation component 5 such as an LSI on a printed board 7 through a high heat conductive rubber 6 having a good heat conductivity, and the metal block 2 is attached to the printed board 7 in this state. Heat generated in the heat generation components 5 heats the evaporation part 10 of each heat pipe 1 to evaporate the working liquid sealed inside the pipe 1. This increases the vapor pressure in the evaporation part 10 of the heat pipe 1 so that a vapor flows toward the condensation part 11 where the pressure is low. Heat from the vapor moves to the condensation part 11 and is transferred to the radiation fins 3 and diffused in the air. Accordingly, it is possible to obtain a relatively-small cooling unit having an extremely-high radiation performance.

The metal block 2 and the evaporation part 10 of each heat pipe 1 in the above-described cooling unit are provided with heat pipes that are fixed by means of the solder alloy 20 as mentioned above. However, when the material of the metal block is aluminum or aluminum alloy, an oxide film forms on the surface of the metal block preventing the soldering metal from being attached thereon and a void or bubble is generated between the surface of the heat pipe and the inner wall of the insertion hole, and the heat resistance between the heat pipe and the metal block becomes large, thereby lowering the cooling characteristic of the unit. Furthermore, the pipe insertion hole must be made large to increase the amount of the solder to be poured therein in order to suppress generation of the void and fix the heat pipe in the pipe insertion hole. In this case, because the large specific gravity of the solder metal increases the weight of the cooling unit and enlarges the insertion pipe, the thickness of the metal block must also be increased, and reduction in the thickness of the cooling unit can not be achieved.

SUMMARY OF THE INVENTION

It is, therefore, an object of the present invention to provide a method for manufacturing a cooling unit comprising heat pipes which reduces the thickness of the metal block resulting in lighter weight of the entire unit and decreased heat resistance when connecting the metal block with the heat pipes to achieve excellent heat dissipation or heat removal performance and to provide a cooling unit.

According to a first embodiment of the present invention, there is provided a cooling unit manufacturing method comprising the steps of:

(a) preparing a substantially-plate-type metal block for removing heat generated from an electronic component, the metal block having holes in the thickness of the metal block into which heat pipes are inserted and having convex portions formed on one main surface or both main surfaces of the plate-type body corresponding with the holes;

(b) inserting the heat pipes into the holes for removing heat of the metal block; and (c) applying local and two-dimensional force from the surface of the metal block to the convex portions to make the surface substantially flat after inserting the heat pipes into the holes and bringing the outer surface of each heat pipe into close contact with the inner wall of each hole in the metal block.

According to a second embodiment of the present invention, there is provided the cooling unit manufacturing method, wherein each hole into which the heat pipe is inserted has a substantially circular cross section and the heat pipe has a substantially circular cross section.

According to a third embodiment of the present invention, there is provided the cooling unit manufacturing method, wherein each of the convex portions has a substantially rectangular or trapezoidal cross section.

According to a fourth embodiment of the present invention, there is provided the cooling unit manufacturing method, wherein each of the convex portions has a substantially triangular cross section.

According to a fifth embodiment of the present invention, there is provided the cooling unit manufacturing method, wherein each of the convex portions has a cross section substantially shaped corresponds to a combination of a trapezoid and a triangle.

According to a sixth embodiment of the present invention, there is provided the cooling unit manufacturing method, wherein the metal block is made of aluminum or aluminum alloy.

According to a seventh embodiment of the present invention, there is provided a cooling unit comprising the metal block and heat pipes produced by the above manufacturing method.

According to an eighth embodiment of the present invention, there is provided a cooling unit manufacturing method comprising the steps of:

(a) preparing a substantially-plate-type metal block for removing heat generated from an electronic component, the metal block having holes in the thickness of the metal block into which heat pipes are inserted and having U-shaped grooves each provided with protruding portions on at least one main surface or both main surfaces of the plate-type body corresponding with the holes;

(b) providing heat pipes in the U-shaped grooves for removing heat of the metal block; and (c) applying local and two-dimensional force from the surface of the metal block to the protruding convex portions to make the surface substantially flat after mounting the heat pipes on the U-shaped grooves and to bring the outer surface of each heat pipes into close contact with the inner wall of each hole in the metal block.

According to a ninth embodiment of the present invention, there is provided the cooling unit manufacturing method, wherein each of the holes in which the heat pipes are inserted has a substantially circular cross section and each of the heat pipes has a substantially circular cross section.

According to a tenth embodiment of the present invention, there is provided the cooling unit manufacturing method, wherein convex portions are further formed on the other surface with which the U-shaped grooves having the protruding portions from the main surface correspond.

According to an eleventh embodiment of the present invention, wherein each of the further-formed convex portions has a substantially trapezoidal shape.

According to a twelfth embodiment of the present invention, there is provided the cooling unit manufacturing method, wherein the metal block is made of aluminum or aluminum alloy.

According to a thirteenth embodiment of the present invention, there is provided a cooling unit comprising the metal block and the heat pipes which are produced by the above manufacturing method.

According to a fourteenth embodiment of the present invention, there is provided a cooling unit manufacturing method comprising the steps of:

(a) preparing a substantially-plate-type metal block for removing heat generated from an electronic component, the metal block having holes in the thickness part of the metal block into which the heat pipes are inserted and having convex portions formed on one main surface of the metal block corresponding to the holes;

(b) inserting the heat pipes into the holes for removing heat from the metal block; and (c) applying local and two-dimensional force to the surface of the metal block to the convex portions to make the surface substantially flat after inserting the heat pipes into the holes and to bring the outer surface of each heat pipe into close contact with the inner wall of each hole in the metal block.

According to a fifteenth embodiment of the present invention, there is provided the cooling unit manufacturing method, wherein each of the holes into which the heat pipes are inserted has a substantially circular shape and each of the heat pipes has a substantially circular shape.

According to a sixteenth embodiment of the present invention, there is provided the cooling unit manufacturing method, wherein each of the convex portions has a substantially trapezoidal or rectangular shape.

According to a seventeenth embodiment of the present invention, there is provided the cooling unit manufacturing method, wherein the metal block is made of aluminum or aluminum alloy.

According to an eighteenth embodiment of the present invention, there is provided a cooling unit comprising the metal block and the heat pipes which is produced by the manufacturing method comprising the steps of:

(a) preparing a substantially plate-type metal block for removing heat generated from an electronic component, the metal block having a hole in the thickness of the metal bock and having a convex portion formed on one main surface of the metal block corresponding to the hole;

(b) inserting a heat pipe into the hole for removing heat from the metal block; and (c) applying local and two-dimensional force from the surface of the metal block to the convex portion to make the surface substantially flat and to bring the outer surface of each heat pipe into close contact with the inner wall of each hole in the metal block.

BRIEF DESCRIPTION OF THE DRAWINGS

FIGS. 2A–C illustrates various cross sections of a heat pipe manufactured according to the present invention after pressure has been applied;

FIGS. 3A–B illustrates the cooling unit having convex portions formed on both surfaces of a metal block according to another embodiment of the present invention;

FIGS. 4A–C illustrates cross sectional views of the cooling unit having triangular convex portions on both surfaces, trapezoidal convex portions on one surface and triangular convex portions on the other surface according to still another embodiment of the present invention;

FIGS. 8A–C illustrates cross-sectional views of various heat pipes of the embodiment shown in FIG. 7A–B;

FIG. 9 illustrates a perspective view of a method for manufacturing the cooling unit according to another embodiment of the present invention;

FIGS. 10A–B illustrates a manufacturing method according to the embodiment shown in FIG. 9;

FIG. 11 is a perspective view of a test sample assembled for testing the effect of the cooling unit according to the present invention;

DETAILED DESCRIPTION OF THE PRESENTLY PREFERRED EMBODIMENT OF THE INVENTION

The present invention will now be described in detail with reference to the accompanying drawings. In the following description, a heat pipe has a circular cross section with a diameter that ranges from 2 to 5 mm and a rod type heat pipe having a length of approximately 50 to 200 mm and being made of copper or aluminum. Further, a metal block is usually made of aluminum or aluminum alloy to reduce weight.

Figure 1A:
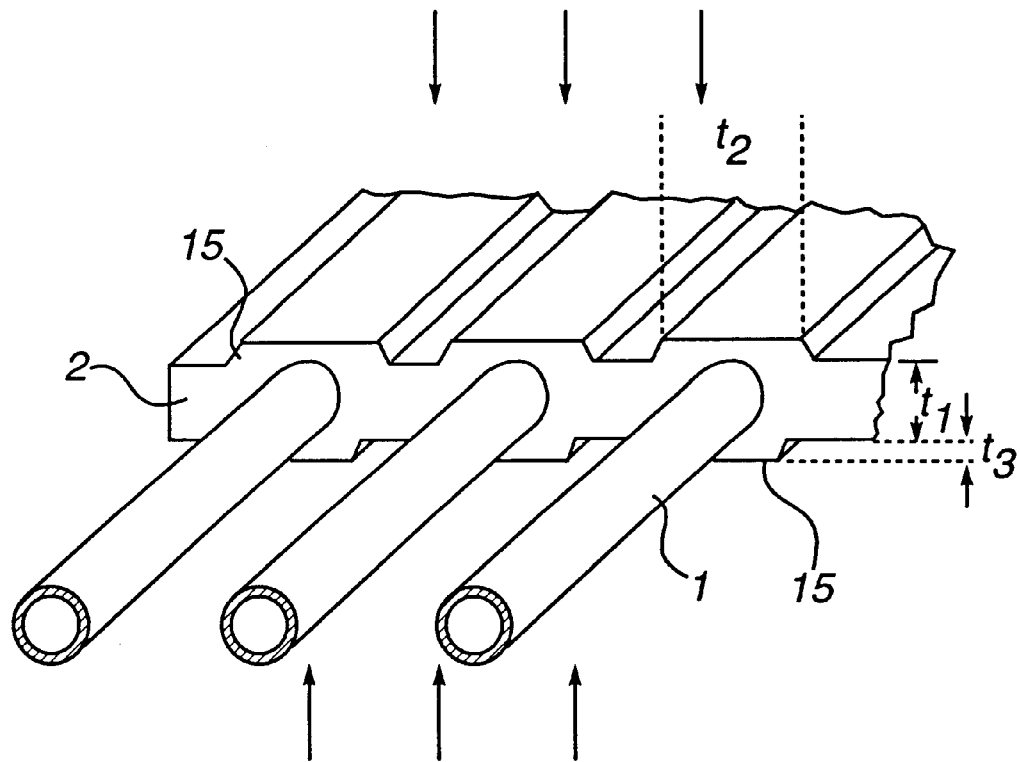
FIGS. 1A–B illustrates a cooling unit according to an embodiment of the present invention.
Figure 1B:
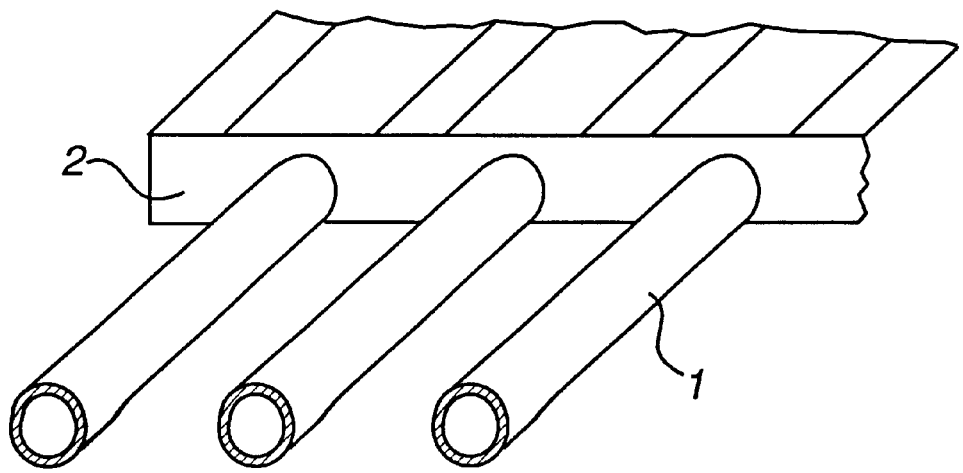
Figure 16:
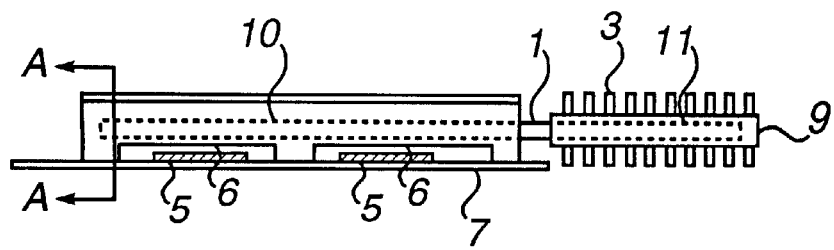
FIG. 16 is a cross-sectional view showing a prior art cooling unit.

According to the present invention, FIG. 1(b) shows one embodiment of a cooling unit provided with heat pipes. A metal block 2 is a plate which is made of aluminum or aluminum alloy and has outer dimensions of 100×200 mm and a thickness of 3 mm. Each copper heat pipe 1 has an outer diameter of 3 mm. As shown in FIG. 1, the part of the heat pipe 1 that is inserted into the metal block 2 is flat while the part of the heat pipe 1 which is outside the metal block 2 being circular. As shown in FIG. 16, fins 3 are provided at one end of each heat pipe 1 by blurring for the purpose of heat dissipation and are attached to the heat pipe 1 by caulking.

A description will now be given as to a method for fixing the heat pipes 1 to the metal block 2. The shape of the metal block 2 made of aluminum has a thickness $t_1$ equal to 3 mm at a portion where no heat pipe 1 is inserted, and substantially trapezoidal or rectangular convex portions 15 each of which has a width of $t_2$ equal to 4 mm and a height $t_3$ equal to 0.4 mm provided on the metal block 2 portions where the heat pipes 1 are inserted in such a manner that the convex portions 15 are on opposing surfaces of the aluminum metal block 2. The metal block 2 having such a shape can be manufactured by hot-pressing or abrading aluminum. A circular insertion hole having a diameter of 3.2 mm is formed in one cross section of the metal block and each copper heat pipe having an outer diameter of 3 mm is inserted into the insertion hole. At this point in time, the heat pipe 1 has a circular cross section at the portion inserted into the hole.

In this state, the pressure of 40 kg/cm² is applied in both the upward and downward directions, as shown by arrows in FIG. 1(a). Such a mechanical pressure is preferably applied to the convex portions 15 and the inserted heat pipe is deformed to have a substantially flat shape as shown in FIG. 1(b). The type of deformation depends on values of the width $t_2$ or the height $t_3$ of the convex portion 15 or how the mechanical pressure is applied. Although this shape is preferably flat such that both main surfaces are completely flat as shown in FIG. 2(a), no problem occurs in the practical use even if the central part slightly projects as shown in FIG. 2(b) or the central part is slightly concave as shown in FIG. 2(c). Further, if the main surface of the metal block 2 (the surface wider than the side surface) is previously machined to have a shape conforming with that of the electronic component to be mounted, contact made between the metal block 2 and the electronic component can be improved, thereby increasing the heat removal efficiency. FIG. 2(b) shows an embodiment in which the surface of the metal block that is thermally connected with at least the electronic component is desired to be sufficiently smooth, and the main surface of the metal block 2 is smoothed by pressure application using a press or the like or abrasion or other methods if necessary. This maintains good contact with the electronic component which should be cooled down, thus realizing high performance. It is to be noted that FIG. 1 shows a case where the number of heat pipes used is three wherein the number and the interval between the respective pipes can be appropriately determined by taking the number of electronic components to be cooled down and the quantity of generated heat into account.

As mentioned above, the cross section of the heat pipe 1 inserted into the metal block 2 is deformed to have a substantially-flat shape by application of mechanical pressure, the flat plane of the substantially-flat shape is pressed against the inner wall of the metal block 2 with very strong force to realize sufficient thermal contact, and the mean distance from the surface of the metal block 2 to the heat pipe 1 is shortened, thereby reducing the heat resistance in the heat conduction.

FIG. 3(a) shows a variation of the first embodiment according to the present invention, which is similar to the above example in that each convex portion 15 is provided on both surfaces of the metal block 2 at the portion where the heat pipe is inserted into the metal block but different from the example shown in FIG. 1 in that the thickness of the metal block 2 into which the heat pipe 1 is inserted is larger than the outer diameter of the heat pipe 1. That is, in the embodiment shown in FIG. 3, an outer diameter of the heat pipe 1 is 3 mm; the metal block 2 has a thickness $t_1$ equal to 4 mm; the convex portion 15 has a width $t_2$ equal to 4 mm and a height $t_3$ equal to 0.2 mm; and the insertion hole has an outer diameter of 3.2 mm. If the thickness of the metal block 2 is larger than the outer diameter of the heat pipe 1, as it is in this embodiment, it is desirable that the height of the convex portion 15 is larger than the gap between the insertion hole formed in the base metal block and the outer diameter of the heat pipe 1 and that an area of the cross section of the convex portion 15 is larger than that of the gap. With the heat pipe 1 being inserted into the insertion hole as shown in FIG. 3(a), press working is performed to obtain a shape illustrated in FIG. 3(b). In this method, because the quantity of deformation caused by pressure application is small as compared with the example shown in FIG. 1, pressing can be done at an ordinary temperature, and the time for applying pressure can be advantageously shortened.

Although FIG. 3(a) shows an example where each convex portion 15 has a substantially trapezoidal or rectangular cross section, the cross section is not restricted to a substantially trapezoidal or rectangular shape. It may have, for example, a substantially triangular shape having a width of 2 mm and a height of 0.5 mm as shown in FIG. 4(a). Also, the convex portion on both surfaces of the metal block may have a cross section which is a combination of a substantially trapezoidal or rectangular shape and a substantially triangular shape as shown in FIG. 4(b). In addition, the convex portions 15 may be provided on both surfaces of the metal block 2 in such a manner that they are opposed to each other as shown in FIG. 4(c), or the convex portions 15 may be alternately provided on both surfaces with respect to one heat pipe. In this case, because the quantity of deformation of the heat pipe is small, such an arrangement is effective especially when the diameter of the pipe is small and often is adopted when securing the passage of the heat pipe working liquid.

Figures 5A, 5B:
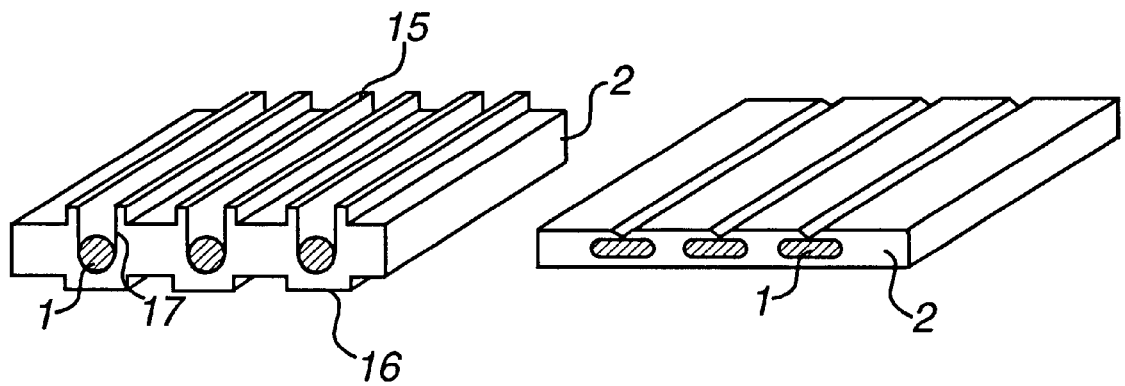
FIGS. 5A–C illustrates a further embodiment of the present invention wherein groove portions into which the heat pipes are inserted are U-shaped grooves having the convex portions protruding from the surface.
Figure 5C:
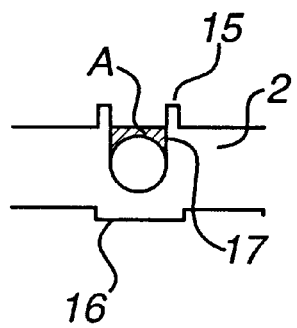

FIG. 5 shows another embodiment according to the present invention. As shown in FIG. 5(a), U-shaped grooves 17 for mounting the heat pipe 1 are formed on one surface of the metal block 2, and convex portions 15 are provided on side parts of the grooves 17 while convex portions 16 each having a substantially-trapezoidal or rectangular cross section are provided on the other surface of the metal block 2. In this case, two convex portions 15 are formed on side portions of each groove which preferably have a cross sectional area larger than the difference between the cross-sectional area of the U-shaped groove and that of the heat pipe, i.e., the cross-sectional area A shown by notched lines in FIG. 5(c). In FIG. 5, an aluminum plate having a thickness of 5 mm is used as the metal block 2, an U-shaped groove 17 having a width of 3.2 mm and a depth of 4 mm is formed on one surface of the plate, a convex portion 15 having a cross section of 1 mm×1 mm is provided on each of the side portions of the groove, and a convex portion 16 having a height of 0.2 mm and a width of 2 mm is provided on the back surface of the metal block 2. The heat pipe 1 having an outer diameter of 3 mm is mounted in the U-shaped groove 17 of the metal block 2, and mechanical force is applied to the surface of the metal block 2 by using a press machine. As a result, the heat pipe 1 is deformed to have a substantially flat shape and the heat pipe 1 and the metal block 2 are thermally and closely connected as shown in FIG. 5(b).

Figure 6A:
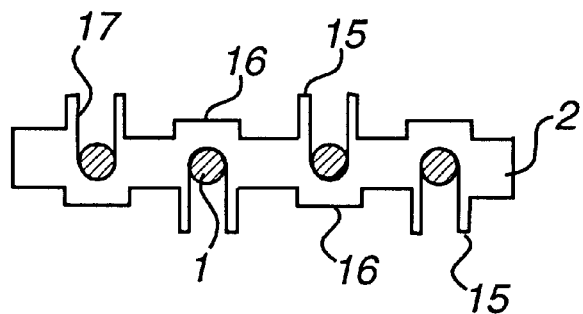
FIGS. 6A–B illustrates cross-sectional views showing different arrangements of the U-shaped grooves.
Figure 6B:
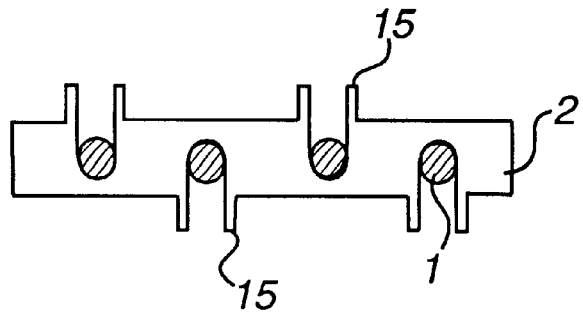

Although FIG. 5 shows the example in which the U-shaped groove 17 is formed on one surface of the metal block 2 while the convex portion 16 is provided on the other surface of the metal block 2, the U-shaped groove 17 and the convex portion 16 may be alternately arranged as shown in FIG. 6(a). Alternatively, only the convex portions 15 formed on the side portions of the U-shaped groove 17 may be employed without using the convex portions 16 formed on the other surface, as shown in FIG. 6(b).

Figure 7A:
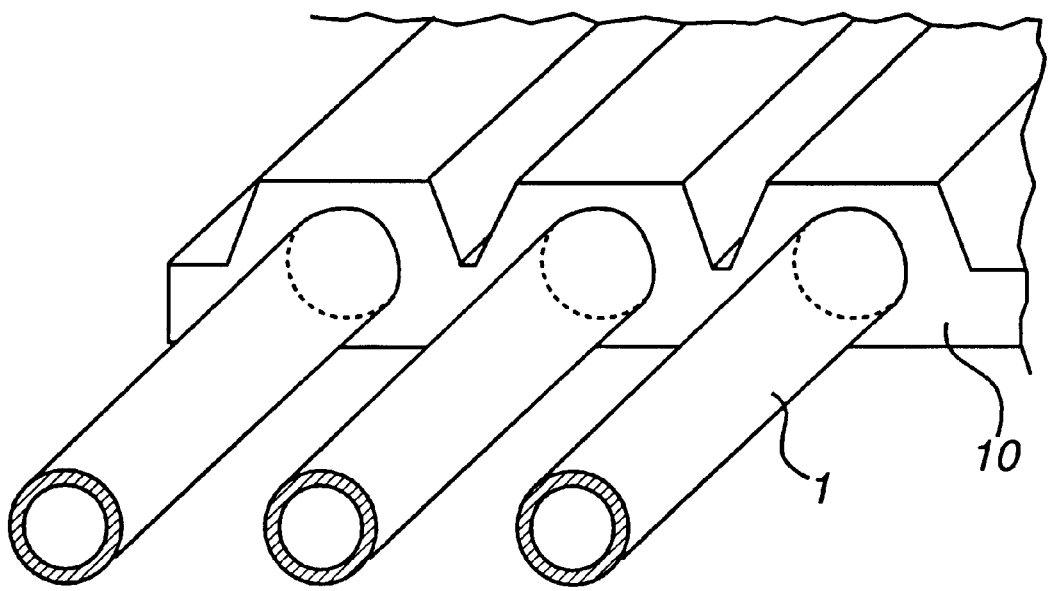
FIGS. 7A–B illustrates a cooling unit according to a further embodiment of the present invention wherein the convex portions are provided on only one main surface of the metal block.
Figure 7B:
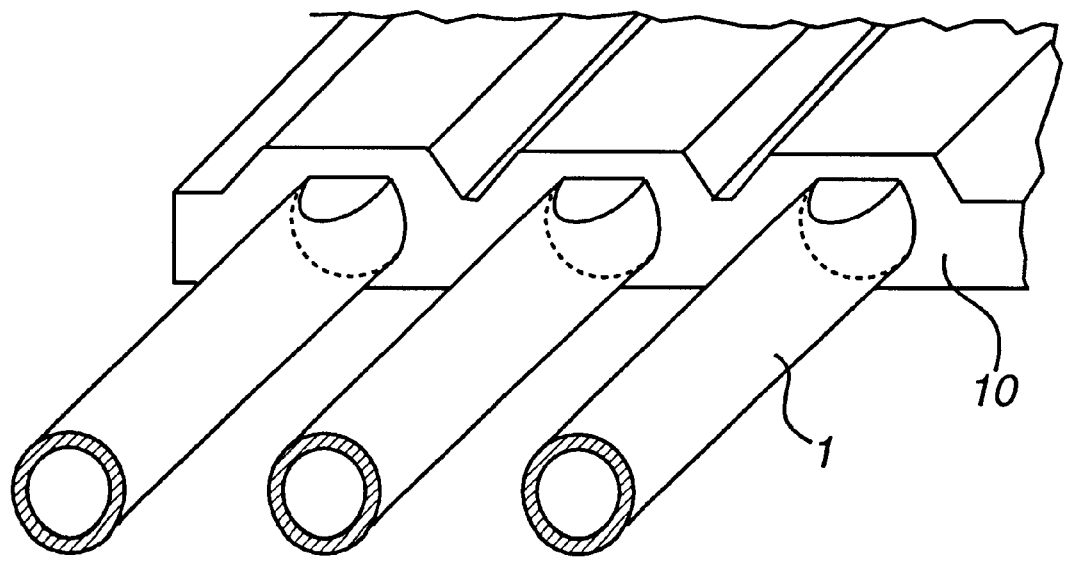

FIG. 7 illustrates yet another embodiment of the present invention. In this embodiment, substantially trapezoidal or rectangular convex portions are provided on one main surface of the metal block, and holes in which the circular heat pipes are inserted are formed in the corresponding thick parts of the convex portions. After inserting the heat pipes into these holes, the metal block is pressed by, for example, a press so that a part of the circumferential portion of each heat pipe becomes flat. In this case, the cross section of each heat pipe is deformed as shown in FIG. 8 depending on the degrees of the pressure or pressing employed by the method. The thermal contact achieved between the metal block and the heat pipes is superior to that attained by the solder alloy.

FIGS. 9 and 10 show another method for pressing the metal block such that the cross section of each heat pipe has a substantially semicircular shape. In this case, the circular insertion hole is previously formed in the plate-type metal block. A spacer is set at a position where the heat pipe is inserted after inserting the heat pipe having a circular cross section in order to give pressure using a pressing machine. The circular heat pipe is then pressed to have a semicircular cross section as shown in the drawings, and the thermal contact between the metal block and the heat pipe is improved.

The following describes the specific effect of the thermal contact between the metal block and the heat pipe in the embodiments according to the present invention.

FIG. 11 is a schematic view showing a cooling unit according to the present invention. The block 20 is made of aluminum (A1100, a Japanese Standard for an aluminum alloy) and is a plate type having dimensions of 50 mm×30 mm. This cooling unit was manufactured as follows. The block having a hole with a diameter equal to 3.1 mm was formed. The block has a thickness of 4 mm at a portion where the hole is formed and a thickness of 2 mm at any other part. The copper heat pipe having a diameter of 3 mm, an overall length equal to 200 mm, a thickness equal to 0.3 mm, water was used as the working liquid, and a small groove formed inside (not shown) was inserted into the hole. The part of the block having a thickness of 4 mm was subsequently subjected to press working along the thickness direction so that the part of the block to which the heat pipe was inserted had a thickness of 3 mm. As a result, the inserted heat pipe 1 was deformed to have a substantially semicircular shape, and the hole was also deformed to have a substantially semicircular shape, as shown in FIG. 11. In this way, a sample of the block 20 which is shown in FIG. 11 and attached to both ends of the heat pipe 1 having a length equal to 200 mm was manufactured.

Figure 13:
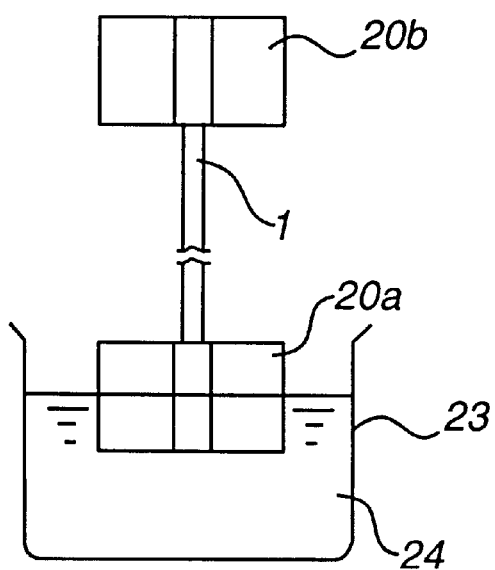
FIG. 13 is a skematic view of a method for testing the effect of heat removal of the cooling unit.
Figure 14:
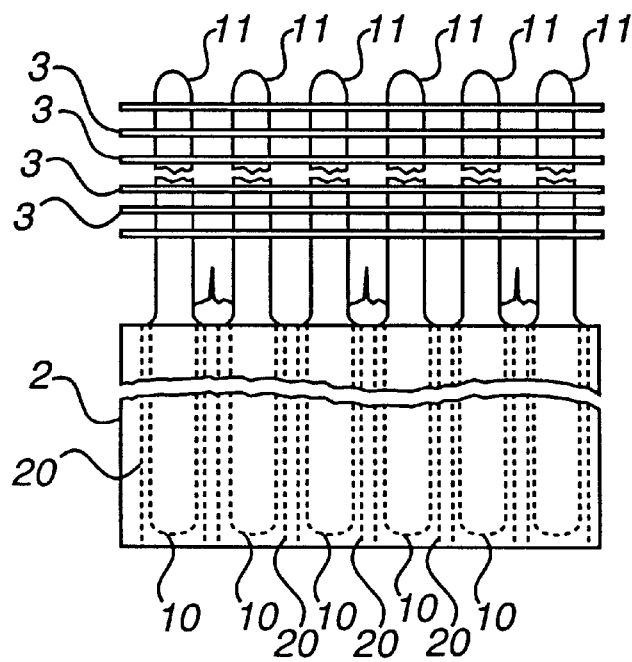
FIG. 14 is a plan view of a prior art cooling unit.
Figure 15:
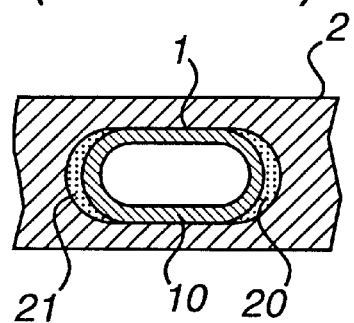
FIG. 15 is a plan view illustrating a connection between the metal block and the heat pipe in the prior art cooling unit.

As shown in FIG. 13, one sample block 20a was soaked in hot water 24 having a temperature of 60 degrees Celsius. Here, the heat pipe 1 was maintained so as to be substantially vertical for five minutes in such a manner that approximately 15 mm of the block 20a was soaked in the hot water. After five minutes, the block 20a was taken out from the hot water 24, and temperatures of the block 20a and the metal block 20b at their central parts were rapidly measured and compared. The result showed that a difference between the temperatures of the block 20a and the block 20b was 6 degrees Celsius.

COMPARATIVE EXAMPLE 1

As a comparative example, the plate-type aluminum block (A1100) having no convex portion on the main surface and having the dimensions of 50 mm×30 mm and the thickness of 4 mm was prepared. A hole was formed in the block at a position similar to that of the example shown in FIG. 11, and the block was flattened by mechanical pressing after inserting the heat pipe into the hole, thereby producing the primary component of the cooling unit according to the present invention. The thickness of the block, including the part into which the heat pipe is inserted, before applying the mechanical press was uniformly 4 mm, but application of the press changed the thickness to 3 mm. As a result, the heat pipe was deformed to have a substantially-elliptical shape at the part inserted into the block.

The performance of this comparative example was similarly measured as that of the first embodiment. The measurement showed that the difference in temperature between the metal blocks at both ends of the heat pipe was approximately 7 degrees Celsius. Compared with the first embodiment, although the heat capacity of the metal block is different to some extent, it can be noticed that the first embodiment realizes heat conduction property superior to that of comparative example 1.

EMBODIMENT 2

In this embodiment, a sample such as shown in FIG. 11 was produced by the manufacturing method illustrated in FIG. 1. The specific dimensions are the same as those described in connection with FIG. 1. It is to be noted that the block 21 is made of aluminum A1100 and is of a plate type having the dimensions of 50 mm×30 mm. One heat pipe was inserted into a hole having a diameter of 3.1 mm which was formed in the metal block having a thickness of 4 mm and press working was applied. The performance evaluation of the cooling unit was similarly carried out as that of the first embodiment and showed that a difference in temperature of the blocks 21 provided on both ends of the heat pipe 1 was 7 degrees Celsius.

Figure 12:
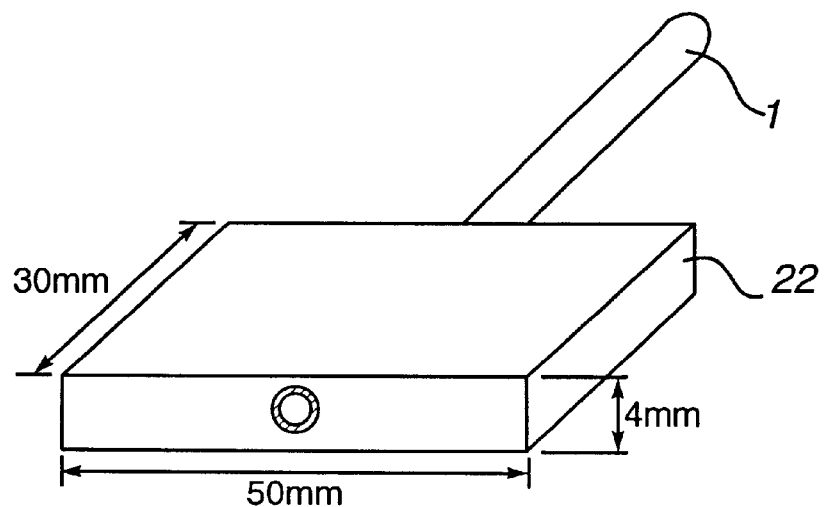
FIG. 12 is a perspective view showing a prior art cooling unit.

FIG. 12 is a perspective view schematically showing a primary component of a conventional cooling unit. The block 22 is made of aluminum (A1100) and is of a plate type having the dimensions of 50 mm×30 mm. The thickness of the block 22 is 4 mm. A heat pipe 1 and block 22 are connected to each other by means of soldering. As to the manufacturing method, the melted solder alloy (composition: Sn/Pb=6/4) is filled in a hole having a diameter of 3.3 mm into which the heat pipe 1 is inserted with the block 22 being set on edge. In this state, the heat pipe 1 is slowly inserted and the solder alloy is then set. As a result of the performance evaluation similar to that effected in the first embodiment, it was found that a difference in temperature between the blocks 21 provided at both ends of the heat pipe 1 was 8 degrees Celsius.

As is apparent from the results of the above-mentioned performance evaluation of the primary component in the cooling unit, a difference in temperature between the blocks provided on both ends of the heat pipe is small and the good thermal contact between the heat pipe and the block is realized in the embodiments of the present invention. Therefore, use of the cooling unit according to the present invention as such a cooling unit shown in FIG. 1 enables the efficient heat removal or heat radiation from the electronic components. As compared with the above-described prior art, the cooling unit according to the present invention can be readily manufactured and is advantageous in terms of cost.

As explained above in detail, according to the present invention, the holes or U-shaped grooves for mounting the heat pipes are formed in the metal block for attaching a heat generation part of the electronic component, the convex portions are provided in the metal block at positions where the heat pipes are mounted, and the mechanical force is applied using a pressing machine or the like after inserting the heat pipes in order to connect the heat pipes with the metal block. Thus, the cross section of each heat pipe is deformed to have a flat shape, and the outer surface of each heat pipe is closely brought into contact with the inner wall of each hole or each groove of the metal block to cause heat resistance to be prominently decreased at the contact part, thereby resulting in a cooling unit provided with heat pipes which has an extremely-high efficiency of heat radiation or cooling.

Further, because the metal block and the heat pipes do not have to be connected by means of the solder alloy, the thickness of the metal block can be decreased, resulting in reduction in size and weight of the cooling unit. Furthermore, when at least one surface of the metal block is made flat and smooth by machining, the heat generation part and the metal block are closely connected with each other, which enables improvement of the heat radiation or cooling characteristic.

What is claimed is:

1. A cooling unit manufacturing method comprising the steps of:

(a) preparing a substantially plate-type metal block for removing heat generated from an electronic component, said metal block having a U-shaped groove provided with a protruding portion from at least one main surface or both main surfaces of the metal block;

(b) inserting a heat pipe into said U-shaped groove for removing heat of the metal block; and (c) applying local and two-dimensional force from the surface of the metal block to the protruding portion to make the surface substantially flat and bringing each heat pipe into close contact with the inner wall of each U-shaped groove in the metal block.

2. A cooling unit manufacturing method according to claim 1, wherein said U-shaped groove into which the heat pipe is inserted has a substantially circular cross section and the heat pipe has a substantially circular cross section.

3. A cooling unit manufacturing method according to claim 1, wherein a convex portion is further formed on the other main surface of the metal block at a location that corresponds to where the U-shaped groove having the protruding portion is provided on the main surface.

4. A cooling unit manufacturing method according to claim 1, wherein said convex portion formed on the other main surface, to which the U-shaped groove having the protruding portion correspond, has a substantially trapezoidal shape.

5. A cooling unit manufacturing method according to claim 1, wherein said metal block is made of one of aluminum and aluminum alloy.

6. A cooling unit comprising the metal block and the heat pipe which is produced by the manufacturing method defined in claim 1.

\* \* \* \* \*

UNITED STATES PATENT AND TRADEMARK OFFICE
CERTIFICATE OF CORRECTION

PATENT NO. : 6,189,213 B1
DATED : February 20, 2001
INVENTOR(S) : Kimura et al.

Page 1 of 1

It is certified that error appears in the above-identified patent and that said Letters Patent is hereby corrected as shown below:

<u>Title Page,</u>
Item (62), delete [Nov. 4] and insert in its place --Nov. 14--

Signed and Sealed this

Seventh Day of August, 2001

*Attest:*

*Attesting Officer*

NICHOLAS P. GODICI
*Acting Director of the United States Patent and Trademark Office*